United States Patent
van Bentum et al.

(10) Patent No.: US 7,176,110 B2
(45) Date of Patent: Feb. 13, 2007

(54) TECHNIQUE FOR FORMING TRANSISTORS HAVING RAISED DRAIN AND SOURCE REGIONS WITH DIFFERENT HEIGHTS

(75) Inventors: Ralf van Bentum, Radebeul (DE); Scott Luning, Dresden (DE); Thorsten Kammler, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 1 day.

(21) Appl. No.: 10/862,518

(22) Filed: Jun. 7, 2004

(65) Prior Publication Data
US 2005/0095820 A1 May 5, 2005

(30) Foreign Application Priority Data
Oct. 31, 2003 (DE) ................. 103 51 008

(51) Int. Cl.
*H01L 21/20* (2006.01)
*H01L 21/36* (2006.01)

(52) U.S. Cl. .............. 438/478; 438/300; 438/142; 438/197; 438/595

(58) Field of Classification Search ............. 438/222, 438/226, 300
See application file for complete search history.

(56) References Cited

U.S. PATENT DOCUMENTS

| | | | |
|---|---|---|---|
| 5,268,324 A * | 12/1993 | Aitken et al. .............. 438/217 |
| 5,665,616 A * | 9/1997 | Kimura et al. ............. 438/234 |
| 5,856,225 A | 1/1999 | Lee et al. ................... 438/291 |
| 5,875,665 A * | 3/1999 | Yamamoto et al. ......... 72/21.1 |
| 5,970,351 A | 10/1999 | Takeuchi .................... 438/300 |
| 6,165,826 A * | 12/2000 | Chau et al. ................ 438/231 |
| 6,235,568 B1 | 5/2001 | Murthy et al. ............. 438/231 |
| 6,800,530 B2 * | 10/2004 | Lee et al. ................... 438/301 |
| 6,906,360 B2 * | 6/2005 | Chen et al. ................. 257/204 |
| 6,967,382 B2 * | 11/2005 | Kim .......................... 257/377 |
| 7,018,891 B2 * | 3/2006 | Doris et al. ................ 438/243 |
| 2002/0005553 A1 | 1/2002 | Ootsuka et al. ............ 257/369 |
| 2002/0106855 A1 | 8/2002 | Sato et al. .................. 438/241 |
| 2002/0158292 A1 | 10/2002 | Abe et al. ................... 257/408 |
| 2003/0052372 A1 * | 3/2003 | Ibara et al. ................ 257/379 |
| 2003/0164513 A1 * | 9/2003 | Ping et al. ................. 257/288 |
| 2003/0230811 A1 * | 12/2003 | Kim .......................... 257/758 |
| 2005/0127408 A1 * | 6/2005 | Doris et al. ................ 257/288 |

* cited by examiner

*Primary Examiner*—Michael Lebentritt
*Assistant Examiner*—Angel Roman
(74) *Attorney, Agent, or Firm*—Williams, Morgan & Amerson, P.C.

(57) ABSTRACT

The height of epitaxially grown semiconductor regions in extremely scaled semiconductor devices may be adjusted individually for different device regions in that two or more epitaxial growth steps may be carried out, wherein an epitaxial growth mask selectively suppresses the formation of a semiconductor region in a specified device region. In other embodiments, a common epitaxial growth process may be used for two or more different device regions and subsequently a selective oxidation process may be performed on selected device regions so as to precisely reduce the height of the previously epitaxially grown semiconductor regions in the selected areas.

4 Claims, 6 Drawing Sheets

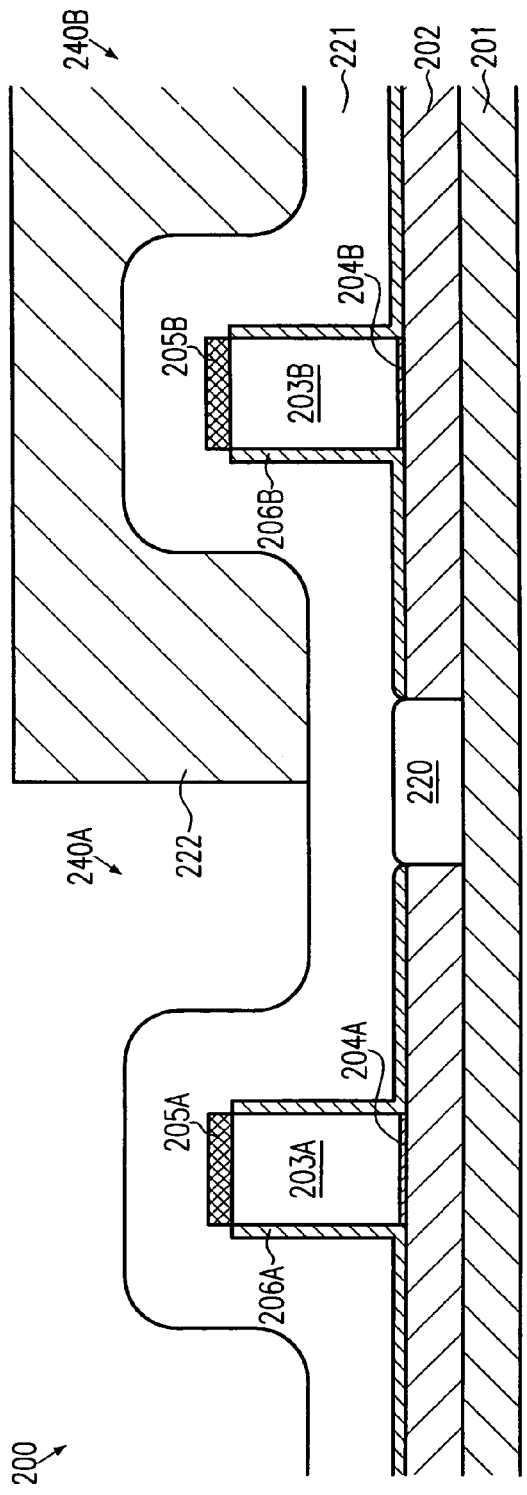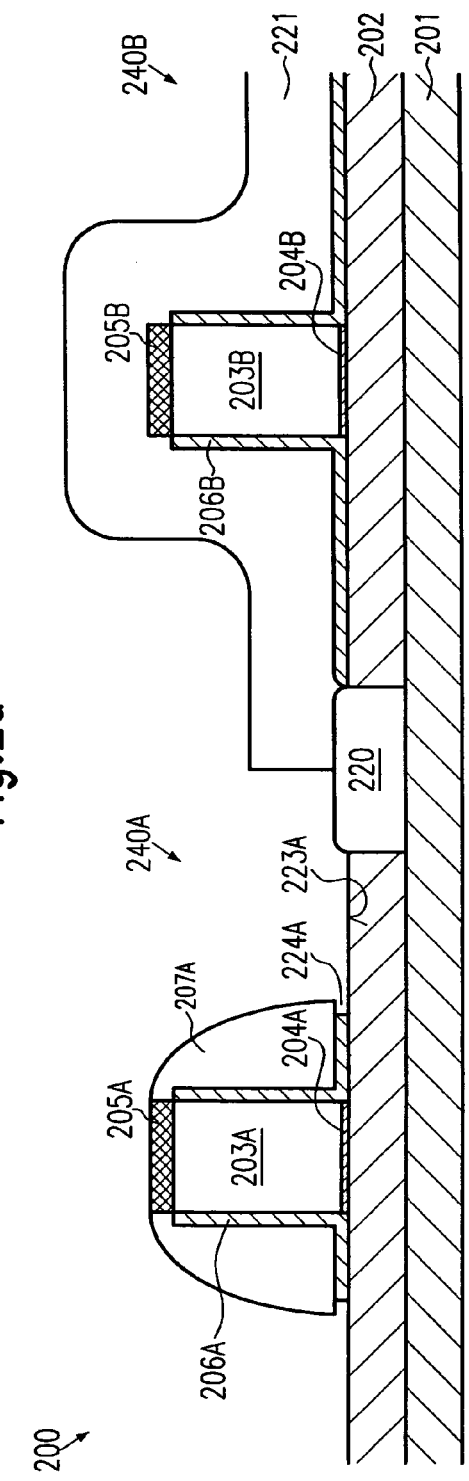

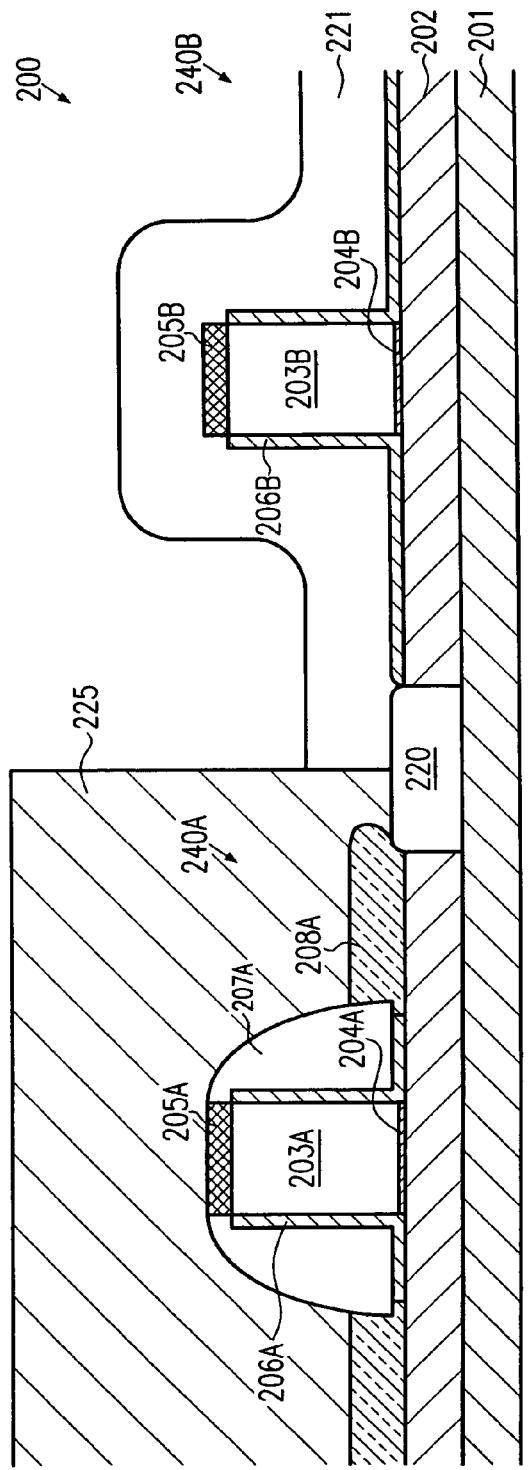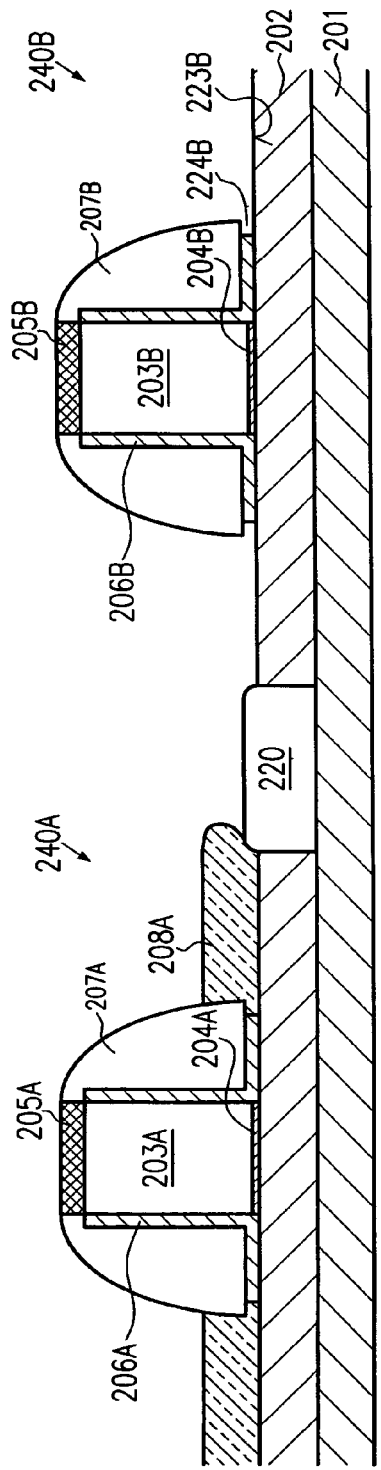

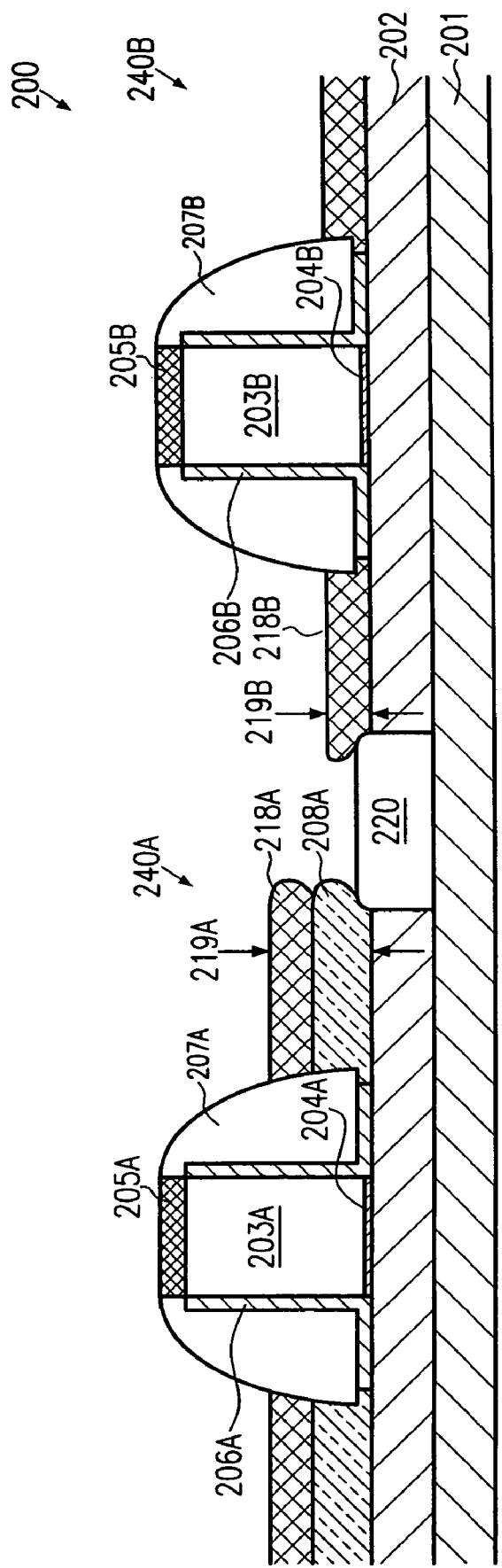

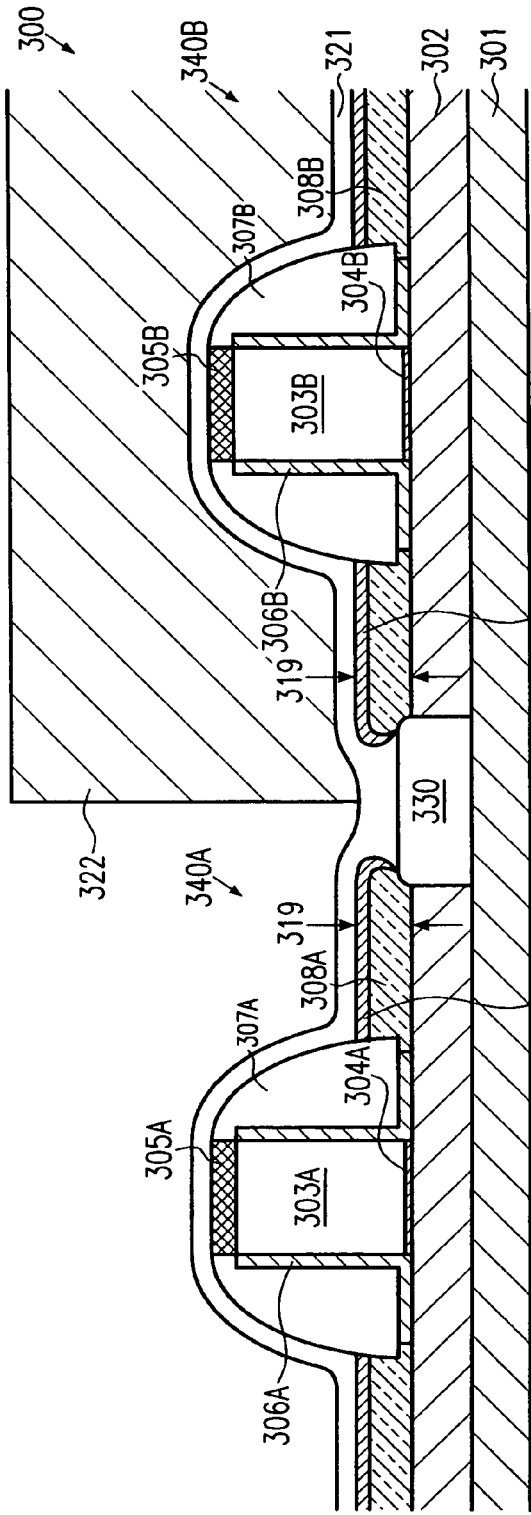
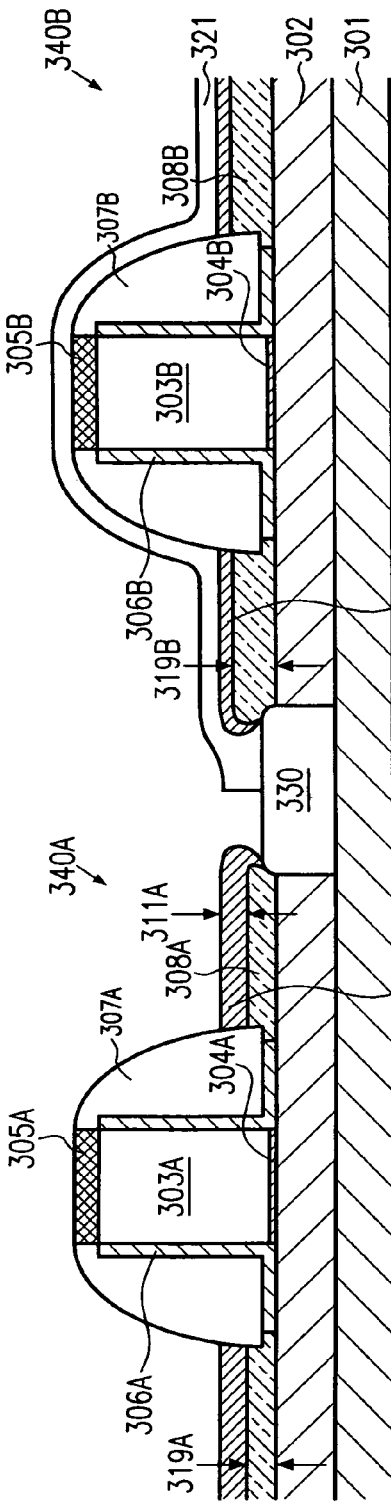
Fig.3a
Fig.3b

TECHNIQUE FOR FORMING TRANSISTORS HAVING RAISED DRAIN AND SOURCE REGIONS WITH DIFFERENT HEIGHTS

BACKGROUND OF THE INVENTION

1. Field of the Invention

The present invention generally relates to the fabrication of integrated circuits, and, more particularly, to the formation of locally raised semiconductor regions, such as raised drain and source regions of field effect transistors having extremely shallow PN junctions.

2. Description of the Related Art

The fabrication of integrated circuits requires the formation of a large number of circuit elements on a given chip area according to a specified circuit layout. Generally, a plurality of process technologies are currently practiced, wherein for logic circuitry, such as microprocessors, storage chips and the like, CMOS technology is currently the most promising approach due to the superior characteristics in view of operating speed and/or power consumption. During the fabrication of complex integrated circuits using the CMOS technology, millions of complementary transistors, i.e., N-channel transistors and P-channel transistors, are formed on an appropriate substrate. Typically, a MOS transistor, irrespective of whether an N-channel transistor or a P-channel transistor is considered, comprises so-called PN-junctions that are formed at an interface of highly doped drain and source regions with an inversely doped channel region disposed between the drain region and the source region. The conductivity of the channel region is controlled by a gate electrode formed above the channel region and separated therefrom by a thin insulating layer. The conductivity of the channel region depends on the dopant concentration, the mobility of the majority charge carriers, and, for a given extension of the channel region in the transistor width direction, the distance between the source and drain region, which is also referred to as channel length. Hence, in combination with the capability of rapidly creating a conductive channel below the insulating layer upon application of a specified control voltage to the gate electrode, the conductivity of the channel region substantially determines the characteristics of the MOS transistors. For this reason, the channel length represents a dominant design criterion and a size reduction thereof provides increased operating speed of the integrated circuits.

The shrinkage of the transistor dimensions, however, entails a plurality of issues associated therewith which have to be addressed so as to not unduly offset the advantages obtained by steadily decreasing the channel length of MOS transistors.

One problem in this respect is the requirement of extremely shallow PN junctions. That is, the depth of the source and drain regions with respect to an interface formed by the gate insulating layer and the channel region has to be decreased as the channel length is reduced so as to maintain the required controllability of the conductive channel. The depth of the source and drain regions substantially determines the sheet resistance thereof, which may not be arbitrarily reduced by correspondingly increasing the dopant concentration in the source and drain regions, since an extremely high dopant concentration may give rise to increased leakage currents. Furthermore, the dopants implanted into these regions at very high concentrations may not be completely activated by conventional rapid thermal anneal cycles without negatively affecting the overall dopant profile within the source and drain regions. That is, for a desired channel length, defined by the PN junctions, an increased dopant concentration requires higher temperatures and/or a prolonged duration of the corresponding anneal cycles, thereby, however, influencing the dopant profile forming the PN junctions by the inevitable thermal diffusion of the dopants, which finally may lead to a non-acceptable variation of the finally achieved channel length.

In an attempt to further reduce the sheet resistance of the drain and source regions, the conductivity thereof is frequently increased by forming a metal silicide of superior conductivity compared to a highly doped silicon. However, since the penetration depth of the metal silicide is restricted by the depth of the PN junctions, the improvement in conductivity in these regions is therefore coupled to the depth of the corresponding PN junctions. Moreover, in many CMOS technologies, a corresponding metal silicide is simultaneously formed on the gate electrode, wherein a shallow junction depth therefore also creates a very shallow metal silicide in the gate electrode, thereby providing only limited improvement in gaining superior gate electrode conductivity.

In one approach, extremely shallow source and drain regions may be formed by raising the source and drain regions above the gate insulation layer/channel region interface and maintaining the drain-source dopant concentration at an acceptable level while providing the possibility of forming highly conductive metal silicide regions without being restricted by the actual depth of the PN junctions due to the increased size of the raised drain and source regions.

With reference to FIGS. 1a–1d, a typical conventional process flow for forming raised drain and source regions will now be described in more detail. FIG. 1a schematically shows a cross-sectional view of a field effect transistor 100 at an early manufacturing stage. The transistor 100 comprises the substrate 101, for instance a bulk silicon substrate or a silicon-on-insulator (SOI) substrate including a buried insulating layer. Above the substrate 101, a substantially crystalline layer 102 is formed with a thickness that is appropriate for forming PN junctions and a channel region therein. For instance, the transistor 100 may represent an SOI transistor with a thickness of the silicon layer 102 in the range of approximately 20–100 nm. A gate electrode 103, comprised of polysilicon, is formed above the silicon layer 102 and is separated therefrom by a gate insulation layer 104. The gate insulation layer 104 may be formed in sophisticated devices by a nitrogen-containing silicon dioxide layer with a thickness of approximately 0.6–4 nm. The residue 105 of an anti-reflective coating covers a top surface 103a of the gate electrode 103, while the sidewalls 103b thereof, as well as the remaining surface of the silicon layer 102, are covered by an oxide liner 106.

The transistor 100 as shown in FIG. 1a may be formed in accordance with the following process flow. The substrate 101 may be obtained by a manufacturer of respective substrates in the form of a silicon bulk substrate or in the form of an SOI substrate, wherein the SOI substrate may comprise a crystalline silicon layer that may be formed in accordance with well-established wafer bonding techniques. The silicon layer 102 having the appropriate thickness may then be formed by corresponding process techniques, such as chemical mechanical polishing, to thin a given silicon layer of an SOI substrate to a desired thickness and/or by epitaxial growth of silicon on the exposed surface of the SOI substrate or the bulk substrate. The epitaxial growth technique of a semiconductor material is a deposition technique in which the deposited material layer forms a crystalline structure in conformity with the crystalline structure of the underlying material as long as the deposited material is able to form a lattice that is sufficiently similar in structure and lattice spacing to the lattice of the underlying material. After the formation of the silicon layer 102, an insulating layer is formed having a thickness and a composition that are appropriate for forming the gate insulation layer 104. To this end, sophisticated oxidation and/or deposition techniques may be used as are well established in the art. Thereafter, a polysilicon layer of appropriate thickness is deposited by low pressure chemical vapor deposition. Next, an anti-reflective coating, for instance comprised of silicon oxynitride, and a resist layer are deposited and are patterned by sophisticated photolithography so as to form an etch mask for a subsequent anisotropic etch process for patterning the gate electrode 103 from the deposited polysilicon layer. Thereafter, the gate insulation layer 104 may be patterned and subsequently the oxide liner 106 may be formed by an appropriately designed oxidation process.

FIG. 1b schematically shows the transistor 100 having formed thereon sidewall spacer elements 107 comprised of a material, such as silicon nitride, that exhibits a moderately high etch selectivity with respect to the underlying oxide liner 106 so that the spacers 107 may be readily removed after a selective epitaxial growth process. The sidewall spacers 107 may be formed by well-established techniques including the deposition, for instance, by plasma enhanced chemical vapor deposition, of a silicon nitride layer of a specified thickness and a subsequent anisotropic etch process, which reliably stops on and in the liner oxide 106, thereby leaving the spacers 107. A width 107a of the spacer 107 is readily controllable by appropriately adjusting the thickness of the silicon nitride layer. Hence, a lateral extension of epitaxial growth regions adjacent to the gate electrode 103 is substantially determined by the spacer width 107a.

FIG. 1c schematically shows the device 100 with selectively grown silicon regions 108 above the silicon layer 102, wherein a lateral distance of the regions 108 from the gate electrode 103 substantially corresponds to the spacer width 107a (FIG. 1b) plus the minimal thickness of the liner oxide 106. The transistor 100 as shown in FIG. 1c may be obtained by the following processes. Starting from the device as shown in FIG. 1b, the liner oxide 106 is selectively etched so as to expose the silicon layer 102 at portions that are not covered by the spacers 107, the gate electrode 103 and any isolation structures (not shown). Before and/or after the removal of the liner oxide 106, well-established cleaning procedures may be carried out so as to remove oxide residues and other contaminants that may have accumulated in a surface region of the silicon layer 102. Thereafter, silicon is selectively grown on exposed portions of the silicon layer 102, thereby forming the silicon regions 108 with a specified thickness in conformity with design requirements. Thereafter, the spacer 107 is removed by a selective etch process, for instance, by using hot phosphoric acid, which exhibits an excellent etch selectivity to silicon dioxide and silicon. During this etch process, the residue 105 on top of the gate electrode 103 may also be removed. Thereafter, a conventional process sequence may be performed, as is the case for transistor devices without having the additional selectively grown silicon regions 108. That is, an appropriate number of sidewall spacers may be formed, followed by appropriately designed implantation sequences, so as to establish a required dopant profile in the silicon layer 102.

FIG. 1d schematically shows the transistor 100 after the above mentioned transistor formation process using, for instance, three different sidewall spacers. In FIG. 1d, a first sidewall spacer 109, for instance comprised of silicon dioxide, is located adjacent to the oxide liner 106 and has an appropriate thickness for profiling the dopant concentration in the vicinity of the gate electrode 103 during a subsequent implantation sequence. A second spacer 110 is located next to the first spacer 109 and separated therefrom by an additional liner 106a, followed by an oxide line 111 and a third spacer 112. The width of these spacers 109 and 112 is appropriately selected so as to obtain the desired dopant extension regions 113 and the drain and source regions 114, thereby defining a channel region 115 between the extensions 113 with a specified channel length 116.

During the formation of the spacer 109, if comprised of silicon dioxide, the liner 106 is typically etched off the surface portion of the semiconductor layer 102. Therefore, usually the additional liner 106a is deposited prior to the formation of the spacer 110. If the first spacer 109 is comprised of silicon nitride, the liner 106 is preserved during the anisotropic etch for forming the spacer 109, however, possibly with an inhomogeneous thickness owing to the etch induced damage. Therefore, the liner 106 may be removed and the additional liner 106a may also be deposited in this case. Generally, the formation of the spacers 109, 110 and 112 may be accomplished by well-established spacer technologies, such as described with reference to the spacer 107, wherein the corresponding spacer width may be controlled by the corresponding deposition thicknesses of the respective spacer layers, for instance comprised of silicon nitride, wherein the first spacer 109 and the oxide liner 111 provide the required etch selectivity in anisotropically patterning the spacers.

As a result, the above-described process flow enables the formation of required shallow PN junctions in the form of the extensions 113, while nevertheless providing a low contact resistance to the drain and source regions 114 by providing the additional selectively grown silicon regions 108, which may be used to receive a highly conductive metal silicide, wherein the silicidation process does not adversely affect the extensions 113, nor is the silicidation process restricted by the depth of the extensions 113 and the drain and source regions 114.

Although the process flow described above provides significant improvements in forming raised drain and source regions, there is still room for improvements with regard to process flexibility so as to enhance the device performance. For example, during the formation of the drain and source regions 114 by ion implantation, typically the gate electrode 103 is also heavily doped, thereby increasing the conductivity thereof. In P-channel transistors, boron is frequently used as a dopant, which, however, exhibits a high diffusivity during anneal processes. For this reason, the maximum implantation energy for doping the source and drain regions 114 may not be selected as high as it would be desirable in view of obtaining a desired penetration depth in the drain and source regions 114, but instead the integrity of the gate insulation layer 104 and possibly of the channel region 115 with respect to diffusing and/or penetrating boron ions has to be taken into consideration when selecting the implantation parameters, thereby possibly compromising the drain and source characteristics.

In view of these problems, a need exists for a technique that enables the formation of locally raised semiconductor regions, wherein an enhanced flexibility, for instance with respect to the height and/or the dopant concentration of the epitaxial growth regions, is obtained.

SUMMARY OF THE INVENTION

Generally, the present invention is directed to a technique that enables the formation of epitaxially grown semiconductor regions with different heights and/or different dopant concentrations, wherein a high degree of compatibility with the conventional process flow is maintained. Different heights of raised semiconductor regions may be obtained by masking one or more specified regions by means of an epitaxial growth mask while selectively exposing one or more other semiconductor regions during a first epitaxial growth process. Thereafter, one or more further semiconductor regions may be exposed, and a second epitaxial growth process may be performed so as to further increase the previously formed epitaxial growth regions and to newly grow epitaxial growth regions in the newly-exposed semiconductor regions. This sequence may be repeated if a plurality of differently dimensioned epitaxially grown semiconductor regions are required. In this way, two or more raised semiconductor regions may be formed that have different heights so as to conform to device specific requirements. Moreover, in other illustrative embodiments of the present invention, raised semiconductor regions may be selectively formed by epitaxial growth, and thereafter one or more selected portions of these raised semiconductor regions may be selectively reduced in thickness by, for instance, oxidizing the region so as to precisely reduce a height thereof by subsequently removing the oxidized portions.

According to a further illustrative embodiment of the present invention, a method comprises forming a first epitaxial growth mask that exposes a portion of a first semiconductor region while keeping a second semiconductor region covered. Then, a first raised semiconductor region is formed in the exposed portion of the first semiconductor region and a second epitaxial growth mask is formed above the second semiconductor region, wherein the second epitaxial growth mask exposes a portion of the second semiconductor region. Finally, a second raised semiconductor region is epitaxially grown in the exposed portion of the second semiconductor region.

According to still a further illustrative embodiment of the present invention, a method comprises epitaxially growing a first and a second raised semiconductor region above a first and a second semiconductor region, respectively, and forming an oxidation mask above the first raised semiconductor region. Next, the second raised semiconductor region is selectively oxidized to form an oxidized portion above the second raised semiconductor region. Finally, the oxidized portion of the second raised semiconductor region is selectively removed.

According to yet another illustrative embodiment of the present invention, a semiconductor device comprises a first gate electrode formed above a first semiconductor region and separated therefrom by a first gate insulation layer. A first raised drain and source region is formed and extends above the first gate insulation layer with a first height. Moreover, a second gate electrode is formed above a second semiconductor region and is separated therefrom by a second gate insulation layer. Additionally, a second raised drain and source region is formed and extends above the second gate insulation layer with a second height that differs from the first height.

BRIEF DESCRIPTION OF THE DRAWINGS

The invention may be understood by reference to the following description taken in conjunction with the accompanying drawings, in which like reference numerals identify like elements, and in which:

FIGS. 2a–2e schematically show cross-sectional views of two different semiconductor regions during various manufacturing stages, wherein selectively raised semiconductor regions are formed having different heights above the first and second semiconductor regions in accordance with illustrative embodiments of the present invention; and FIGS. 3a–3b schematically illustrate a first and a second semiconductor region that receive raised epitaxial growth regions by a common epitaxial growth process, wherein the individual height is adjusted by a selective oxidation process.

Figure 1A:
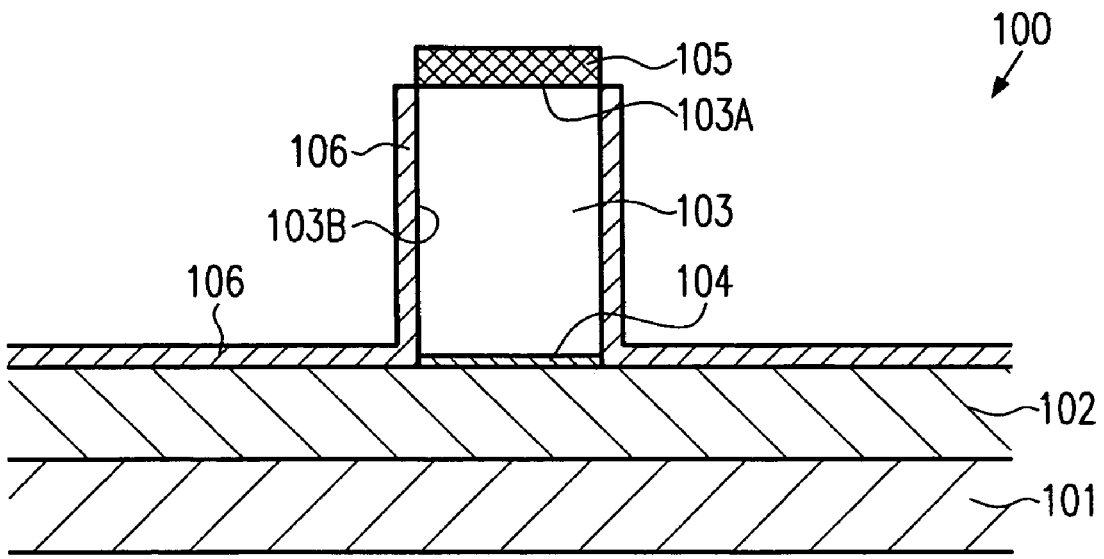
FIGS. 1a–1d schematically show cross-sectional views of a conventional transistor device including raised drain and source regions during various manufacturing stages.
Figure 1B:
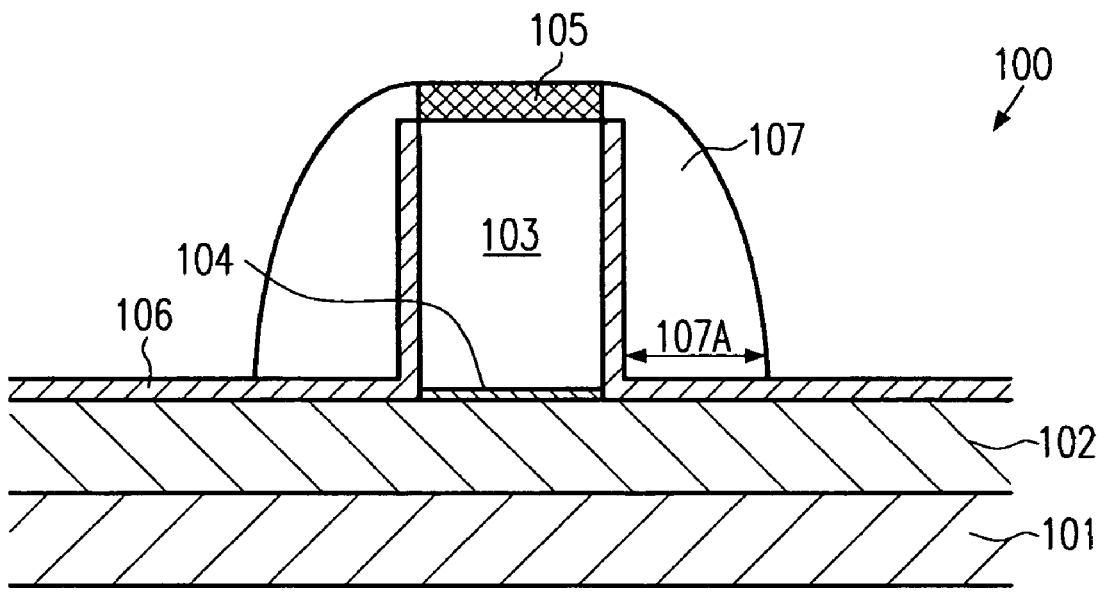

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that the characteristics of selectively epitaxially grown semiconductor regions may be adjusted differently for different types of circuit elements or different areas of a semiconductor substrate. One example of circuit elements for which the above concept may be advantageously used are extremely scaled field effect transistor elements, wherein, due to the reduced feature sizes, even subtle variations of specific design criteria may have a significant impact on the finally obtained transistor performance. For instance, the capacitance of source and drain junctions may require different values at different device locations, which may be taken into account by correspondingly adjusting the height of raised drain and source regions. Moreover, the position of the dopant species for defining the source and drain regions with respect to a semiconductor film, in which raised source and drain regions are formed, may need to be addressed individually for different circuit elements and/or device regions. A further design criterion is the distance of the silicide interface, usually formed to lower the contact resistivity of drain and source regions, with respect to either the position of the PN junction or with respect to the bottom portion of a semiconductor layer. Hence, this distance may be separately adjusted for various regions of a semiconductor substrate so as to individually enhance the device performance. Moreover, as previously noted, a P-channel transistor may require raised source and drain regions of reduced height so as to take into account the increased penetration depth and diffusivity of boron. Consequently, by means of the reduced height, the implantation parameters may be selected so as to avoid undue degradation of a gate insulation layer while nevertheless providing an optimum dopant profile in the source and drain region having the reduced height.

It should further be noted that, in the following illustrative embodiments, a first and a second transistor element is referred to that are formed on respective semiconductor regions which are to receive epitaxially grown semiconductor regions. The present invention, however, should not be restricted to transistor elements, but may be readily applied to any circuit elements requiring the formation of selectively grown epitaxial growth regions of different characteristics. Nor is the reference to two different semiconductor regions to be considered as restricting, as the embodiments disclosed herein may be readily applied to a plurality of different semiconductor areas requiring an individually adapted characteristic of the epitaxially grown semiconductor regions.

With reference to FIGS. 2a–2e and 3a3b, further illustrative embodiments of the present invention will now be described in more detail. FIG. 2a schematically shows a cross-sectional view of a semiconductor device 200 at an early manufacturing stage. The semiconductor device 200 comprises a substrate 201, which may represent any substrate that is suitable for forming circuit elements thereon. In some embodiments, the substrate 201 may represent a bulk semiconductor substrate, such as a silicon substrate, having formed thereon a semiconductor layer 202, such as a substantially crystalline silicon layer. In other embodiments, the substrate 201 may represent an insulating substrate, for instance any appropriate substrate having formed thereon an insulating layer, such as a silicon dioxide layer, on which is located the semiconductor layer 202, for example in the form of a crystalline layer. It should be noted that in advanced logic circuits based on CMOS technology, SOI (silicon-on-insulator) technology is currently considered preferable for forming highly scaled transistor devices. Hence, in particular embodiments, the semiconductor layer 202 represents a crystalline silicon layer with a thickness of approximately 5–50 nm that is formed on an insulating layer, often referred to as buried oxide. The semiconductor device 200 further comprises a first device region 240a and a second device region 240b, which are separated from each other and electrically insulated by an isolation structure 220. The isolation structure 220 may be provided in the form of a trench isolation structure that may extend down to the substrate 201 so as to substantially completely electrically insulate the first and second device regions 240a, 240b. It is to be noted that the first and second device regions 240a, 240b are illustrated as neighboring device regions so as to form, for instance, a complementary pair of field effect transistors, whereas in other embodiments the first and second device regions 240a, 240b may represent areas that are significantly spaced apart from each other within a single chip area or are even located in different chip areas within the substrate 201. For instance, different areas of a semiconductor wafer may require the formation of differently dimensioned epitaxial growth regions so as to provide integrated circuits having other performance characteristics compared to integrated circuits that are formed on other areas.

The first and second device regions 240a, 240b comprise gate electrodes 203a, 203b formed on respective gate insulation layers 204a, 204b. Moreover, respective liners 206a, 206b, for instance comprised of silicon dioxide, are formed on sidewalls of the gate electrodes 203a, 203b and surface portions of the semiconductor layer 202. A top surface of the gate electrodes 203a, 203b are covered by respective cover layers 205a, 205b, which may represent the residue of an anti-reflective coating. Furthermore, a spacer layer 221, for instance comprised of silicon nitride, is formed above the first and second device regions 240a, 240b. In addition, an etch mask 222 is formed over the semiconductor device 200 such that the second device region 240b is substantially completely covered so as to avoid or at least slow down a material removal of the spacer layer 221 in the second device region 240b during a subsequent anisotropic etch process.

A typical process flow for forming the semiconductor device 200 as shown in FIG. 2a may substantially include the same process steps as previously explained with referenced to FIG. 1a, wherein the formation of the isolation structure 220 may be accomplished by well-established photolithography, deposition and etch techniques. Furthermore, corresponding implantation cycles with respective masking steps may be performed so as to establish a desired vertical dopant profile in the semiconductor layer 202 for the first and second device regions 240a, 240b in accordance with the device specifications. In addition to the conventional process flow as described with reference to FIG. 1a, in the present invention, the etch mask 222, for instance comprised of a resist material, is formed prior to a first anisotropic etch process so as to form sidewall spacers 207a from the spacer layer 221 in the first device region 240a.

FIG. 2b schematically shows the semiconductor device 200 after the completion of the anisotropic etch process, during which sidewall spacers 207a have been formed adjacent to the gate electrode 203a. Moreover, in FIG. 2b, the etch mask 220 is removed and portions of the liner 206a in the first device region 240a are removed so as to expose surface portions 223a of the semiconductor layer 202. The selective removal of the liner 206a may be accomplished by any appropriate etch procedure and, in particular embodiments when the liner 206a is comprised of silicon dioxide, may be achieved by a wet etch process using hydrogen fluoride (HF), whereby under-etch areas 224a may be created. Thereafter, suitable cleaning processes may be performed so as to remove any material residues from the exposed surface portions 223a and/or to remove any contaminants in a surface region of the semiconductor layer 202, wherein the remaining spacer layer 221 reliably maintains an integrity of the second device region 240b. Subsequently, a first epitaxial growth process may be performed, wherein the remaining spacer layer 221 acts as a "global" epitaxial growth mask for the second device region 240b so as to avoid any semiconductor growth on the second device region 240b. Similarly, the sidewall spacers 207a and the cap layer 205a serve as a "local" growth mask and restrict the epitaxial growth to the surface portion 223a and to the under-etch regions 224a that may have been formed during the partial removal of the liner 206a.

FIG. 2c schematically shows the semiconductor device 200 with an epitaxially grown semiconductor region 208a that is selectively grown in the first device region 240a. A thickness or height of the epitaxially grown semiconductor region 208a is adjusted during the epitaxial growth process such that the growth process results, in combination with a further epitaxial growth process for forming an epitaxially grown semiconductor region in the second device region 240b, and possibly in combination with additional epitaxial steps when a plurality of differently dimensioned epitaxially grown semiconductor regions are to be formed, in the finally desired height of the semiconductor region 208a. Moreover, in some embodiments, one or more dopant species may be introduced during the epitaxial growth of the semiconductor region 208a, thereby providing increased process flexibility in subsequent implantation steps for forming drain and source regions by ion implantation. In one embodiment, the initial height of the epitaxially grown semiconductor region 208a may range from approximately 1–10 nm.

In FIG. 2c, a second etch mask 225 is illustrated that substantially covers the first device region 240a so as to substantially avoid any material removal and/or damage in the first device region 240a during a subsequent anisotropic etch process for patterning the remaining spacer layer 221 in the second device region 240b.

FIG. 2d schematically shows the device 200 after completion of the anisotropic etch process, resulting in the formation of sidewall spacers 207b adjacent to the gate electrode 203b. Moreover, the liner 206b is partially removed in the second device region 240b so as to expose the surface portions 223b of the semiconductor layer 202, wherein, depending on the removal process, under-etch portions 224b may have been formed, as is also explained with reference to the first device region 240a. After any cleaning processes for removing material residues and contaminants from the exposed surface portions 223b and of course from the epitaxially grown regions 208a, a further (second) epitaxial growth process is performed, wherein the process parameters are selected so as to obtain a required height of an epitaxially grown region in the second device region 240b if this epitaxial growth process is the last process for the device 200. In other embodiments, when a further epitaxial growth process is to be carried out for a further device region (not shown) that has been covered by a respective epitaxial growth mask during the first epitaxial growth step and is still covered by the epitaxial growth mask during this second epitaxial growth step, the process parameters are selected so as to obtain an intermediate height, which in combination with the subsequent epitaxial growth, results in the finally desired height for the first and second device regions 240a, 240b and the further device region.

FIG. 2e schematically shows the device 200 after completion of the second epitaxial growth step to form raised semiconductor regions 218b adjacent to the gate electrode 203b and form additional epitaxial growth regions 218a on top of the previously grown region 208a. Hence, the combination of the epitaxially grown regions 208a, 218a results in a final thickness 219a that is larger than a corresponding final thickness 219b in the second device region 240b. For instance, the second device region 240b may represent a P-channel transistor, wherein the reduced thickness 219b of the raised semiconductor regions 218b compared to the thickness 219a provides the possibility of deeply implanting boron ions into the semiconductor layer 202, while maintaining the superior performance of an N-channel transistor having the increased height 219a and nevertheless avoiding an undue degradation of the gate insulation layer 204b by penetrating and diffusing boron ions. In other aspects, the respective heights 219a, 219b may be selected so as to individually adjust the overall capacitance of drain and source regions of the semiconductor devices, or to correspondingly adjust the distance between metal silicide regions, which are typically formed for enhancing the conductivity of source and drain regions still to be formed, and the bottom of the semiconductor layer 202.

Figure 1C:
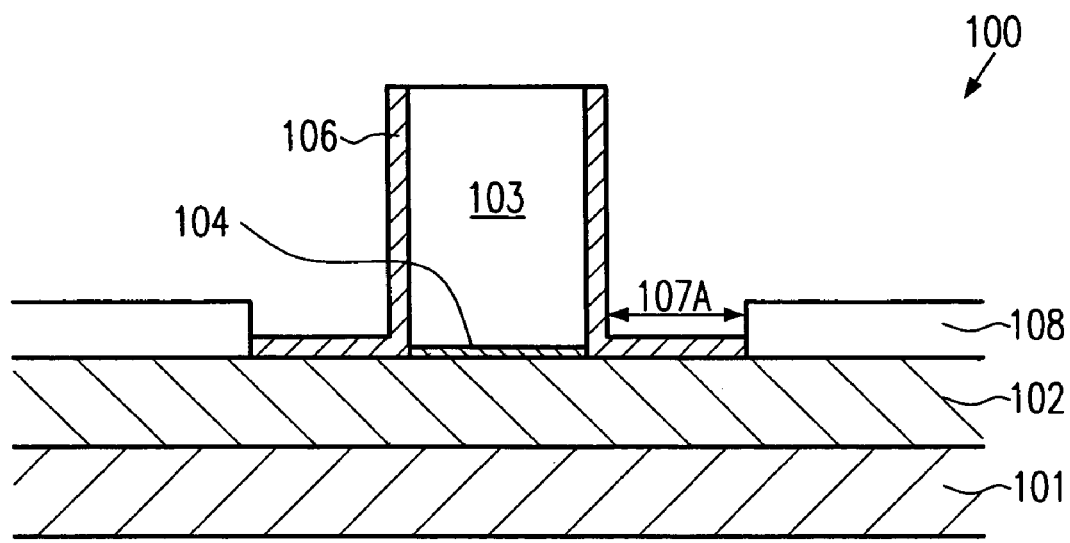
Figure 1D:
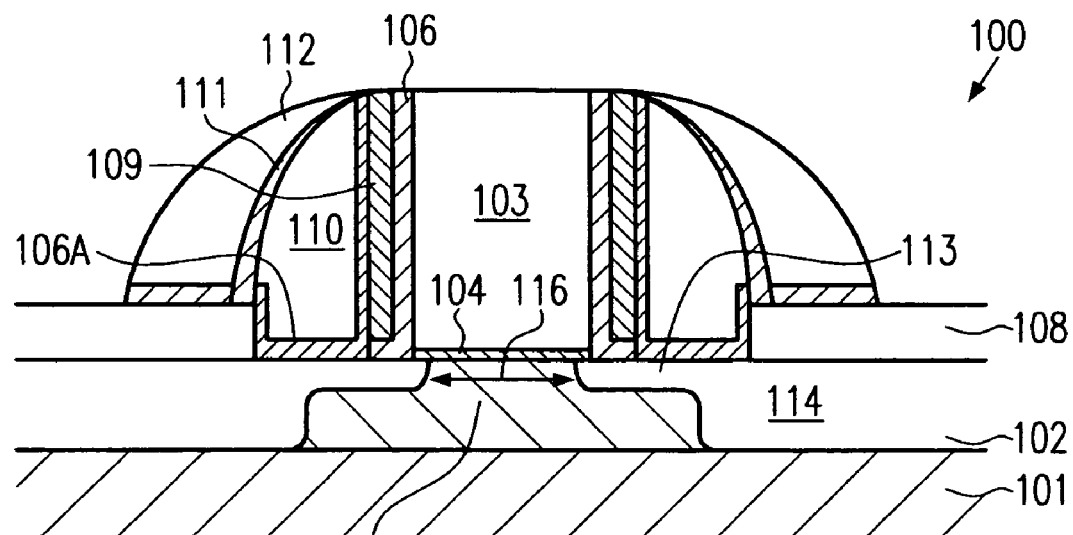

After the second epitaxial growth process, the further manufacturing process may be resumed substantially in a similar way as is described with reference to FIGS. 1c and 1d. That is, the spacers 207a, 207b and the cap layers 205a, 205b may be removed, for instance by hot phosphoric acid, and corresponding implantation cycles using corresponding spacers as required may be performed so as to obtain a desired dopant profile as is necessary for corresponding drain and source regions, including respective extension regions. Thereafter, corresponding metal silicide regions may be formed at least in the raised semiconductor regions 218a and 218b in accordance with design requirements.

It should be noted that, in the above-illustrated embodiments, the first and second device regions 240a, 240b are separated by the isolation structure 220. In other embodiments, the separation between two different device regions may not necessarily be represented by a trench isolation, but may simply be represented by any physical boundary, or may be simply defined by design requirements based on specific criteria, such as functionality of a circuit layout and the like. Hence, the separation into the first and second device regions 240a, 240b is substantially obtained by the formation of the first and second etch masks 222, 225, wherein alignment errors, due to the photolithography involved in forming the first and second etch masks 222, 225, may result in an intermediate region that may experience an anisotropic etch atmosphere during patterning of the sidewall spacers 207a and during patterning of the sidewall spacers 207b. In such cases, the liner 206a may advantageously be formed with an appropriate thickness so as to have the capability to withstand two anisotropic etch procedures substantially without exposing any underlying material layers to the anisotropic etch ambient.

In the embodiments described with reference to FIGS. 2a–2e, the spacer layer 221 (FIG. 2a) is anisotropically patterned in the first device region 240a while being covered in the second device region 240b, thereby acting as a "local" epitaxial growth mask in the first device region 240a in the form of the spacers 207a. On the other hand, the non-patterned spacer layer 221 serves as a "global" epitaxial growth mask in the second device region 240*b* (FIG. 2*b*). In other embodiments, the spacer layer 221 may be patterned simultaneously in the first and second device regions 240*a*, 240*b*, similarly to the conventional approach, and, after forming corresponding sidewall spacers 207*a*, 207*b* in the first and second device regions 240*a*, 240*b*, a corresponding etch mask, such as the mask 222, may be formed in one of these regions so that in a subsequent process for removing, for instance, the liner 206*a*, the corresponding liner 206*b* is maintained in the second device region 240*b*. The liner 206*b* may then serve in the subsequent epitaxial growth process, in combination with the spacer 207*b* and the cover layer 205*b*, as a global growth mask, substantially preventing the epitaxial growth of semiconductor material on the second device region 240*b*. The subsequent manufacturing process may then be continued as is described with reference to FIG. 2*d*. If the liner 206*b* is to act as an epitaxial growth mask, it may be advantageous to provide the liner 206*a* and 206*b* with an increased thickness compared to the conventional approach so as to substantially maintain the integrity of the liner 206*b* when corresponding cleaning processes are performed so as to remove any material residues from the exposed surface portions 223*a* (FIG. 2*b*) prior to the first epitaxial growth process. Moreover, since the adhesion characteristics of silicon to the liner material of the liner 206*b*, for instance comprised of silicon dioxide, may differ from the adhesion characteristics of the spacer layer 221, for instance comprised of silicon nitride, a corresponding adaptation of the epitaxial growth parameters may be required. For instance the temperature of the epitaxial growth process may be correspondingly adapted so as to substantially avoid any semiconductor deposition on the exposed liner 206*b*.

With reference to FIGS. 3*a*–3*b*, further illustrative embodiments will now be described, wherein the thickness or height of epitaxially grown semiconductor regions are individually reduced by a selective oxidation process.

In FIG. 3*a*, a semiconductor device 300 comprises a first device region 340*a* and a second device region 340*b*. The first device region 340*a* comprises a gate electrode 303*a* formed above a semiconductor layer 302, which in turn is formed on an appropriate substrate 301. Regarding the substrate 301 and the semiconductor layer 302, the same criteria apply here as are already pointed out with reference to the device 200. Moreover, a gate insulation layer 304*a* separates the gate electrode 303*a* from the semiconductor layer 302. A disposable sidewall spacer 307*a* is formed near sidewalls of the gate electrode 303*a* and is separated therefrom by a liner 306*a*. Epitaxially grown semiconductor regions 308*a* are formed adjacent to the disposable sidewall spacers 307*a* with a specified thickness or height 319. The epitaxially grown regions 308*a* may include a liner 309*a*, for instance in the form of an oxidized portion. The second device region 340*b* may comprise corresponding circuit components that are indicated by the same reference numerals, except for the letter "b." In particular, although the dimensions of the various components formed on the second device region 340*b* may differ from those formed on the first device region 340*a*, the height of the epitaxially grown regions 308*b* is substantially the same as for the first device region 340*a* since the regions 308*a* and 308*b* are formed by a common epitaxial growth process. The same holds true for the liner 309*b*. Moreover, the device 300 comprises a mask layer 321, for instance comprised of silicon nitride, wherein a thickness of the mask layer 321 is selected so as to be able to substantially avoid or at least significantly reduce an oxidation of an underlying material when exposed to an oxidizing ambient. For instance, the mask layer 321 may have a thickness of approximately less of 1 nm to several nm when comprised of silicon nitride. Additionally, an etch mask 322 is formed over the second device region 340*b*. The etch mask 322 may be comprised of a resist layer or any other appropriate material having the capability to withstand a specified etch chemistry used for removing the mask layer 321 from the first device region 340*a*.

A typical process flow for forming the device 300 as shown in FIG. 3*a* may comprise the same processes as previously described with reference to FIGS. 2*a*–2*e*, so as to selectively form the epitaxial growth regions 308*a*, 308*b*. Contrary to the conventional process flow, the liner 309*a*, 309*b* may be formed by, for instance, oxidizing the device 300. Thereafter, the mask layer 321 may be deposited, for instance by plasma enhanced chemical vapor deposition, and subsequently the etch mask 322 may be formed by well-established photolithography. Thereafter, the mask layer 321 may be selectively removed from the first device region 340*a*, for instance by a selective isotropic or anisotropic etch process that stops in or on the liner 309*a*. Since the mask layer 321 is highly conformally deposited over the first device region 340*a*, the disposable spacers 307*a* and the cover layer 305*a* remain substantially intact if a substantially anisotropic etch recipe is applied for removing the mask layer 321. In case an anisotropic etch process is used, the thickness of the disposable spacer 307*a* is correspondingly increased by the etch process by the layer thickness of the mask layer 321. Since the thickness of the layer 321 may be selected to be relatively thin, the increase of the width of the disposable spacer 307*a* does not substantially affect the further processing. After the selective removal of the mask layer 321, the etch mask 322 is also removed and thereafter the device 300 is exposed to an oxidizing ambient, for instance, to an oxygen-containing atmosphere at an elevated temperature so as to initiate a highly controllable selective oxidation process in the epitaxially grown region 308*a*, while an oxidation of the regions 308*b* is substantially avoided or at least significantly slowed down by the remaining mask layer 321 preserved on the second device region 340*b*. In other embodiments, an oxidizing solution may be applied to the device 300, possibly after first removing the liner 309*a*, for instance by means of a wet chemical etch process on the basis of hydrogenated fluoride (HF).

FIG. 3*b* schematically shows the device 300 after the completion of the highly controllable selective oxidation process, wherein an oxidized portion 310*a* having a well-controlled thickness 311*a* has been formed above the epitaxially grown region 308*a*. Thereafter, the oxidized portion 310*a* may be removed or the thickness thereof may be reduced, for instance to a value that is similar to that of the liner 309*b* of the second device region 340*b*. The removal of the oxidized portion or the thickness reduction thereof may be accomplished by a wet etch process on the basis of, for example, HF. Next, the disposable spacers 307*a* and the cap layer 305*a* as well as the remaining mask layer 321 and the disposable spacers 307*b* and the cap layer 305*b* may be removed, for instance in a common etch process using hot phosphoric acid. Finally, the liner 309*b* and possibly the remaining part of the oxidized portion 310*a* may be removed selectively to the underlying semiconductor material, thereby providing an epitaxially grown region 308*a* having an effective height 319*a* and providing a height 319*b* of the region 308*b* in the second device region 340*b*. Since the selective oxidation process for forming the oxidized portion 310*a* exhibits a superior controllability compared to typical anisotropic or isotropic etch procedures, the finally obtained height 319a is adjustable with high precision so that corresponding device characteristics may be finely tuned.

The further process for completing the semiconductor device 300 may be conducted as previously explained with reference to FIG. 2b.

As a result, the present invention provides an improved technique to form circuit elements having epitaxially grown semiconductor regions, the heights of which may be individually adjusted in two or more different device regions by selectively providing a global epitaxial growth mask or by selectively reducing a thickness of epitaxially grown regions. In some embodiments, both methods may be combined so as to provide superior flexibility in adjusting the height of epitaxially grown regions in a plurality of device regions. Since epitaxially grown raised source and drain regions are currently considered a preferred technique for forming extremely scaled transistor devices, the present invention is particularly advantageous for devices of critical dimensions of approximately 90 nm or less.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

epitaxially growing a first and a second raised semiconductor region above a first and a second semiconductor region, respectively, wherein each of said first and second semiconductor regions comprises a gate electrode structure extending above a surface of said first and second semiconductor regions;

forming an oxidation mask above said first raised semiconductor region, wherein forming an oxidation mask includes depositing a mask layer and selectively removing said mask layer from above said second semiconductor region;

selectively oxidizing said second raised semiconductor region to form an oxidized portion above said second raised semiconductor region; and selectively removing said oxidized portion of said second raised semiconductor region, wherein said step of selectively removing said oxidized portion of said second raised semiconductor region results in said first and second raised semiconductor regions having differing heights.

2. A method, comprising:

epitaxially growing a first and a second raised semiconductor region above a first and a second semiconductor region, respectively, wherein each of said first and second semiconductor regions comprises a gate electrode structure extending above a surface of said first and second semiconductor regions;

forming an oxidation mask above said first raised semiconductor region by depositing a mask layer and selectively removing said mask layer from above said second semiconductor region;

selectively oxidizing said second raised semiconductor region to form an oxidized portion above said second raised semiconductor region; and selectively removing said oxidized portion of said second raised semiconductor region.

3. A method, comprising:

epitaxially growing a first and a second raised semiconductor region above a first and a second semiconductor region, respectively, wherein each of said first and second semiconductor regions comprises a gate electrode structure extending above a surface of said first and second semiconductor regions;

forming an oxidation mask above said first raised semiconductor region, wherein forming an oxidation mask includes depositing a mask layer and selectively removing said mask layer from above said second semiconductor region;

selectively oxidizing said second raised semiconductor region to form an oxidized portion above said second raised semiconductor region;

selectively removing said oxidized portion of said second raised semiconductor region, wherein said step of selectively removing said oxidized portion of said second raised semiconductor region results in said first and second raised semiconductor regions having differing heights; and forming a disposable sidewall spacer adjacent to said gate electrode structure prior to epitaxially growing said first and second raised semiconductor regions.

4. A method, comprising:

epitaxially growing a first and a second raised semiconductor region above a first and a second semiconductor region, respectively, wherein at least one of said first and second semiconductor regions comprises a structural element extending above a surface of said first and second semiconductor regions and wherein said structural element comprises a gate electrode structure;

forming an oxidation mask above said first raised semiconductor region, wherein forming an oxidation mask includes depositing a mask layer and selectively removing said mask layer from above said second semiconductor region;

selectively oxidizing said second raised semiconductor region to form an oxidized portion above said second raised semiconductor region; and selectively removing said oxidized portion of said second raised semiconductor region, wherein said step of selectively removing said oxidized portion of said second raised semiconductor region results in said first and second raised semiconductor regions having differing heights.

* * * * *